| (12) | United States Patent | (10) Patent No.: | US 10,291,255 B2 |
|---|---|---|---|
| | Bossen | (45) Date of Patent: | May 14, 2019 |

(54) SYSTEM AND METHOD FOR ARITHMETIC ENCODING AND DECODING

(71) Applicant: NTT DOCOMO, INC., Chiyoda-ku, Tokyo (JP)

(72) Inventor: Frank Jan Bossen, Mountain View, CA (US)

(73) Assignee: NTT DOCOMO, INC., Tokyo (JP)

( * ) Notice: Subject to any disclaimer, the term of this patent is extended or adjusted under 35 U.S.C. 154(b) by 0 days.

(21) Appl. No.: 15/948,115

(22) Filed: Apr. 9, 2018

(65) Prior Publication Data

US 2018/0226987 A1 Aug. 9, 2018

Related U.S. Application Data

(63) Continuation of application No. 15/334,736, filed on Oct. 26, 2016, which is a continuation of application
(Continued)

(51) Int. Cl.
| *G06T 9/00* | (2006.01) |
|---|---|
| *H03M 7/40* | (2006.01) |
| *H04N 19/91* | (2014.01) |

(52) U.S. Cl.
CPC .............. *H03M 7/4006* (2013.01); *G06T 9/00* (2013.01); *G06T 9/005* (2013.01);
(Continued)

(58) Field of Classification Search
None
See application file for complete search history.

(56) References Cited

U.S. PATENT DOCUMENTS

| 4,905,297 A | 2/1990 | Langdon et al. |
|---|---|---|
| 4,935,882 A | 6/1990 | Pennebaker et al. |

(Continued)

FOREIGN PATENT DOCUMENTS

| GB | 2330473 A | 4/1999 |
|---|---|---|
| JP | 07-249995 A | 9/1995 |

(Continued)

OTHER PUBLICATIONS

Japanese Office Action for Japanese Application No. P2004-500244, dated Sep. 16, 2008, 5 pages (with translation).
(Continued)

*Primary Examiner* — Matthew C Bella
*Assistant Examiner* — Jose Torres
(74) *Attorney, Agent, or Firm* — Brinks Gilson & Lione

(57) ABSTRACT

An arithmetic encoder is provided for converting an event sequence comprised of a plurality of events to an information sequence comprised of at least one information piece, and includes a core engine for receiving an event of the event sequence, and a probability estimate from a probability estimator, and generating zero or more pieces of the information sequence responsive to the received event and the probability estimate by bounding the ratio of events to information pieces. An arithmetic encoder is provided that is capable of constraining a number of events in at least one event sequence as a function of the number of generated information pieces in at least one information sequence. An arithmetic decoder is provided for converting an information sequence comprised of at least one information piece to an event sequence comprised of a plurality of events, and includes a core engine for processing at least one information piece of the information sequence from the sequencer responsive to a probability estimate received from a probability estimator to generate at least one event by accounting
(Continued)

for a bounded ratio of events to information pieces in the information sequence.

1 Claim, 7 Drawing Sheets

Related U.S. Application Data

No. 12/570,383, filed on Sep. 30, 2009, now Pat. No. 9,577,667, which is a continuation of application No. 10/469,630, filed as application No. PCT/US03/12518 on Apr. 23, 2003, now Pat. No. 7,822,283.

(60) Provisional application No. 60/374,770, filed on Apr. 23, 2002.

(52) U.S. Cl.
CPC ....... *H03M 7/4012* (2013.01); *H03M 7/4018* (2013.01); *H04N 19/91* (2014.11)

(56) References Cited

U.S. PATENT DOCUMENTS

| | | | |
|---|---|---|---|
| 5,086,488 A | 2/1992 | Kato et al. | |
| 5,414,423 A | 5/1995 | Pennebaker | |
| 5,471,207 A | 11/1995 | Zandi et al. | |
| 5,475,388 A * | 12/1995 | Gormish | G06T 9/005 341/106 |
| 5,550,540 A | 8/1996 | Furlan et al. | |
| 5,680,129 A | 10/1997 | Weinberger et al. | |
| 5,686,965 A | 11/1997 | Auld | |
| 5,689,589 A | 11/1997 | Gormish et al. | |
| 5,757,852 A * | 5/1998 | Jericevic | H03M 7/3013 348/384.1 |
| 5,764,804 A * | 6/1998 | Yajima | G06T 9/004 348/27 |
| 5,781,136 A | 7/1998 | Imanaka et al. | |
| 5,877,812 A | 3/1999 | Krause et al. | |
| 5,900,946 A | 5/1999 | Kunitake et al. | |
| 5,986,594 A * | 11/1999 | Nakayama | G06T 9/005 341/107 |
| 6,118,900 A | 9/2000 | Yokose et al. | |
| 6,128,413 A * | 10/2000 | Benamara | G06T 9/005 382/251 |
| 6,188,795 B1 * | 2/2001 | Brady | G06T 9/005 341/107 |
| 6,195,465 B1 | 2/2001 | Zandi et al. | |
| 6,198,848 B1 | 3/2001 | Honma et al. | |
| 6,225,925 B1 | 5/2001 | Bengio et al. | |
| 6,285,790 B1 | 9/2001 | Schwartz | |
| 6,411,231 B1 | 1/2002 | Yanagiya et al. | |
| 6,490,373 B2 | 12/2002 | Hata et al. | |
| 6,535,148 B1 | 3/2003 | Kondo | |
| 6,580,282 B1 | 6/2003 | Lieutard et al. | |
| 6,643,405 B1 | 11/2003 | Sako | |
| 6,661,927 B1 | 12/2003 | Suarez et al. | |
| 6,677,869 B2 | 1/2004 | Horie | |
| 6,804,401 B2 | 10/2004 | Nelson et al. | |
| 7,260,735 B2 | 8/2007 | Hagan | |
| 2003/0086597 A1 | 5/2003 | Ohta et al. | |
| 2003/0118241 A1 | 6/2003 | Zandi et al. | |
| 2003/0185302 A1 | 10/2003 | Abrams, Jr. | |

FOREIGN PATENT DOCUMENTS

| | | |
|---|---|---|
| JP | 07-273664 A | 10/1995 |
| JP | 08-228342 A | 9/1996 |
| JP | 09-018350 A | 1/1997 |
| JP | 2002-033925 A | 1/2002 |
| WO | WO 98/27734 A1 | 6/1998 |

OTHER PUBLICATIONS

Moffat et al., "Arithmetic coding revisited", ACM Transactions on Information Systems, vol. 16, No. 3, Jul. 1998, pp. 256-294.
Van Der Vleuten, Rene, "Low Complexity Arithmetic Coding Implementation", Document JVT-B033, JVT meeting, Geneva, Jan. 2002, pp. 1-13.
Winger et al., "Low Complexity Arithmetic Coding Engine", Document JVT-B036, JVT meeting, Geneva, 2002, pp. 1-10.
Office Action in co-pending U.S. Appl. No. 10/469,630, dated Sep. 2, 2009, 17 pages.
Office Action from co-pending U.S. Appl. No. 10/469,630, dated Jan. 29, 2010, 16 pages.
International Telecommunication Union, "Line Transmission of Non-Telephone Signals-Video Coding for Low Bitrate Communication", ITU-T, Draft H.263, May 2, 1996, 54 pages.
European Search Report for European Application No. 03718500.6, dated May 18, 2010, 5 pages.
Notice of Allowance for co-pending U.S. Appl. No. 10/469,630, dated Jun. 17, 2010, 7 pages.
Examination Report for European Application No. 03718500.6, dated Aug. 27, 2010, 9 pages.
Extended European Search Report for European Application No. 10195913.8, dated Feb. 24, 2011, 8 pages.
Examination Report for counterpart European Application No. 10195913.8, dated Sep. 21, 2011, 7 pages.
Extended Search Report in corresponding European Application No. 15169824.8, dated Sep. 23, 2015, 11 pages.
Bossen, F., "Bounding the Complexity of Arithmetic Decoding", Joint Video Team (JVT) of ISO/IEC MPEG & ITU-T VCEG (ISO/IEC JTC1/SC29/WG11 and ITU-T SG16 Q.6, $3^{rd}$ Meeting: Fairfax, Virginia, USA, May 6-10, 2002, 13 pages.
Extended Search Report in corresponding European Application No. 15169825.5, dated Sep. 23, 2015, 14 pages.
Office Action in corresponding European Application No. 15169824.8, dated Feb. 6, 2018, 13 pages.
Office Action in corresponding European Application No. 15169825.5, dated Feb. 6, 2018, 6 pages.
Office Action in U.S. Appl. No. 15/334,736, dated Aug. 6, 2018, pp. 1-11.
Office Action in Europe Application No. 15169824.8, dated Nov. 8, 2018, pp. 1-16.
Salomon D Ed—Salomon David, "Data Compression: The Complete Reference; Section 2.14, 2.15: (Adaptive) Arithmetic Coding", Data Compression: The Complete Reference, Springer, New York, dated Jan. 1, 1998 (Jan. 1, 1998), p. 69-p. 84, XP002270343.
Office Action in U.S. Appl. No. 15/334,736, dated Jan. 10, 2019, 14 pages.

\* cited by examiner

SYSTEM AND METHOD FOR ARITHMETIC ENCODING AND DECODING

RELATED APPLICATIONS

This application is a continuation application of U.S. patent application Ser. No. 15/334,736 filed Oct. 26, 2016, which is a continuation application of U.S. patent application Ser. No. 12/570,383 filed on Sep. 30, 2009, which is a continuation application of U.S. patent application Ser. No. 10/469,630 filed on May 6, 2004, which is 371 application of PCT/US2003/012518 having an international filing date of Apr. 23, 2003, which claims priority to U.S. provisional application No. 60/374,770 filed on Apr. 23, 2002, the entire contents of which are incorporated herein by reference.

BACKGROUND OF THE INVENTION

This application relates to the processing of data, and more particularly, to the encoding and decoding of data sequences in a reduced complexity bound manner.

It is common to compress a sequence of data (i.e. binary or M-ary information) for sending from a first location to a second location. For example, video data may be generated at the first location, where the data represents a video conference call. The data is typically converted to a sequence of events (i.e. binary events). To deliver the sequence of events to the second location, it is desirable to compress, or encode, the sequence of events to a sequence of information, to reduce the time necessary for transmission of the event sequence to the second location. An arithmetic encoder is typically utilized to compress the sequence of events (i.e. the binary events) to an information sequence of information pieces (i.e. binary bits of information) for sending to the second location. The greater the compression, or encoding efficiency, of the information sequence, the greater the transmission rate of the information sequence to the second location.

Compression is achieved by generating less than one information piece per event being encoded, where ratios of events to information pieces being encoded may reach 64:1 or even 128:1, depending on the probability distribution of the events. An arithmetic decoder is used at the second location for decompressing the information sequence to the event sequence, thus allowing the video data representing the video conference call to be presented to an individual at the second location.

Data compression is used for other purposes as well. Another such use may be to increase video quality given an amount of storage media for storing the event sequence. Encoders may be utilized in this example to store video (i.e. representing a movie) on a Compact Disc Read Only Memory (CD-ROM) or Digital Video Disc Read Only Memory (DVD-ROM), or any other storage media including optical, magnetic or otherwise, for replay at a later time. As discussed above, the ratio of events to information pieces encoded may reach 64:1 or 128:1 depending on the probability distribution of the events. At the later time, a decoder is used to decompress the information sequence to the event sequence, thereby allowing the corresponding video or other data to be used.

However, as encoding efficiency increases at the encoder, a greater amount of processing (i.e. decoding operations) are required at the decoder in order to decode the sequence of information pieces of a given length to the event sequence. Such increased processing requirement may be detrimental, especially where it is desired that the event sequence be provided in a real-time fashion. For example, in the case of an event-sequence representing video, real-time indicates that for the information sequence representing a time period (i.e. 1 second) of video, that the decoder is capable of receiving the information sequence, and decoding the information sequence to the corresponding event sequence within the time period. Sometimes, such real-time processing is not possible with the increased efficiency schemes utilized in conventional encoders.

This invention is directed to solving one or more of the problems discussed above in a novel and simple manner.

BRIEF SUMMARY OF THE INVENTION

In accordance with the invention, there is provided a system and method for reducing the complexity bound in an encoder and a decoder.

In accordance with one aspect of the invention, a system and method for arithmetic encoding of an event sequence comprised of a plurality of events to an information sequence comprised of at least one information piece includes at least one input port for receiving events of the event sequence, and at least one output port. A sequencer is coupled with the at least one input port and the at least one output port and includes a context generator for generating context information for at least one of the received events. A probability estimator is coupled with the sequencer for receiving an event of the event sequence and the corresponding context information from the sequencer, and for generating a probability estimate that the event has a particular value. A core engine is coupled with the sequencer and the probability estimator for receiving the event of the event sequence from the sequencer, and the probability estimate from the probability estimator, and generating 0 or more pieces of the information sequence responsive to the received event and the probability estimate while bounding the ratio of events to information pieces, and providing the 0 or more information pieces of the information sequence to the sequencer, where the generated information pieces are provided as the information sequence at the at least one output port.

In accordance with a further embodiment, the events of the event sequence are binary events, and the information pieces of the information sequence are binary bits of information. In accordance with another embodiment of this aspect, the core processor bounding the ratio of events to information pieces includes bounding the average ratio of events to information pieces. In accordance with a further embodiment, the core processor includes a counter register for tracking a number of events for each information piece, used in bounding the average ratio of events to information pieces to a predetermined ratio value. In a further embodiment yet, the core processor generates at least one stuffing information piece within the information sequence where the ratio of events to information pieces exceeds the predetermined ratio value.

In accordance with another aspect of the invention, an arithmetic decoder and method are provided for converting an information sequence comprised of at least one information piece to an event sequence comprised of a plurality of events, including at least one input port for receiving information pieces of the information sequence, and at least one output port. A sequencer is coupled with the at least one input port and the at least one output port and includes a context generator for generating context information for at least one generated event. A probability estimator is coupled with the sequencer, for receiving a generated event of the events sequence and corresponding context information, and for determining a probability estimate. A core engine is coupled with the sequencer and the probability estimator for processing zero or more information pieces of the information sequence from the sequencer responsive to the probability estimate to generate one event by accounting for a bounded ratio of events to information pieces, wherein the generated event is provided to the probability estimator with corresponding context information from the sequencer for updating the probability estimate, and the generated event is provided to the sequencer for transmittal as the event sequence from the at least one output port.

In accordance with an embodiment of this aspect, the at least one information piece of the information sequence is a binary bit, and the events of the event sequence are binary events. In accordance with a further embodiment, the core engine generating at least one event by accounting for a bounded ratio of events to information pieces includes the core engine generating at least one event by accounting for an average bounded ratio of events to information pieces. In accordance with another further embodiment, the core processor includes a counter register for tracking the number of events to information pieces, used in accounting for the average bounded ratio of events to information pieces being a predetermined average ratio value. In accordance with a further embodiment yet, the core engine utilizes the counter register for identifying stuffing information pieces in the information sequence.

In accordance with yet another aspect of the invention, a core engine is provided for converting an event sequence comprised of a plurality of events to an information sequence comprised of at least one information piece, including a controller for receiving at least one event of the event sequence and a probability estimate for the at least one event, and for generating 0 or more pieces of the information sequence responsive to the received event and the probability estimate by bounding the ratio of events to information pieces.

In accordance with another aspect of the invention, a core engine is provided for converting an information sequence comprised of at least one information piece to an event sequence comprised of a plurality of events, including a controller for receiving at least one information piece of the information sequence and a probability estimate, for generating 0 or more events of the event sequence responsive to the at least one information piece and probability sequence by accounting for a bounded ratio of events to information pieces.

In accordance with yet another aspect of the invention, a sequence of information pieces is generated by an arithmetic encoder from a sequence of events, and includes zero or more stuffing information pieces such that the ratio of events to information pieces is bounded by a predetermined ratio.

In accordance with another aspect of the invention, an entropy coder for converting at least one event sequence, each event sequence including at least one event, to at least one information sequence, each information sequence including at least one information piece, including an arithmetic encoder for generating zero or more information pieces of at least one information sequence responsive to at least one event of at least one event sequence. The entropy encoder further includes a controller coupled with the arithmetic encoder for constraining a number of events in at least one event sequence as a function of the number of generated information pieces in at least one information sequence. In accordance with an embodiment of this aspect, at least one event sequence represents input data partitioned into a number of segments, and the controller constrains a number of events as a function of the number of information pieces by constraining a maximum number of events in at least one event sequence as a function of a linear combination including a number of generated information pieces in at least one information sequence, and the number of segments. In a further embodiment, the entropy encoder is coupled with a processor for converting input data into the at least one sequence of events, where the entropy encoder is capable of sending information regarding a number of generated information pieces of at least one information sequence to the processor. In a further embodiment yet, the processor is capable of reducing an event rate of at least one event sequence responsive to the information received from the entropy encoder.

In accordance with another aspect of the invention, a sequence of information pieces is generated at an entropy encoder from at least one event sequence, each event sequence including a plurality of events, where a number of information pieces in the sequence of information sequence is utilized to constrain a maximum number of events of at least one event sequence as a function of a linear combination including a number of generated information pieces in the sequence of information pieces, and the number of segments.

DETAILED DESCRIPTION OF THE INVENTION

Figure 1:
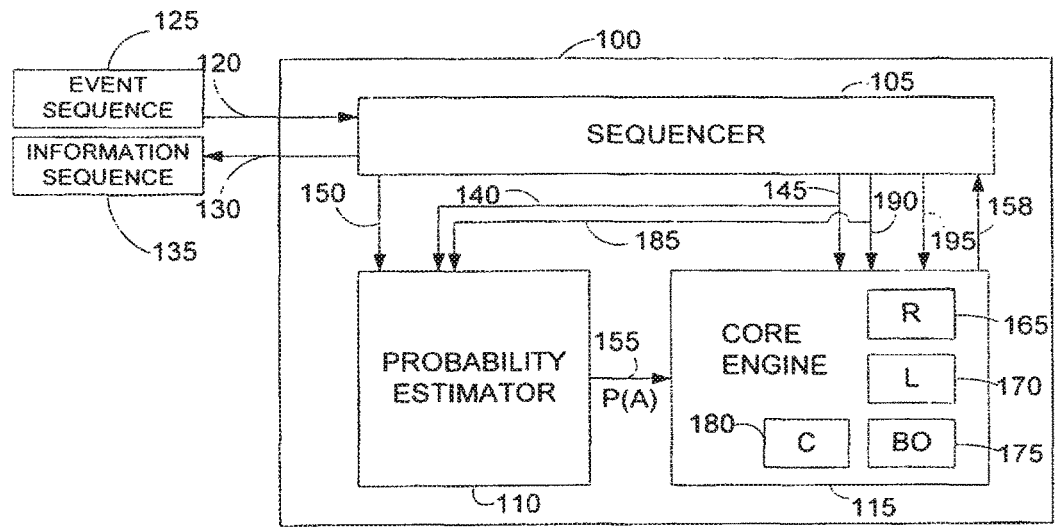
FIG. 1 is a block diagram of an encoder in accordance with an embodiment of the invention.

In accordance with an embodiment of the invention, an arithmetic encoder is provided for converting an event sequence comprised of a plurality of events to an information sequence comprised of at least one information piece, including at least one input port for receiving events of the event sequence, and at least one output port, where a sequencer is coupled with the at least one input port and the at least one output port and includes a context generator for generating context information for at least one of the received events. A probability estimator coupled with the sequencer is provided, for receiving an event of the event sequence and corresponding context information from the sequencer, and for generating a probability estimate that the event has a particular value. A core engine is coupled with the sequencer and the probability estimator for receiving the event of the event sequence from the sequencer, and the probability estimate from the probability estimator, and generating 0 or more pieces of the information sequence responsive to the received event and the probability estimate. The core engine may bound the ratio of events to information pieces, and provides the 0 or more information pieces of the information sequence to the sequencer, where the generated information pieces are provided as the information sequence at the at least one output port.

In accordance with another embodiment of the invention, an arithmetic decoder is also provided for converting n information sequence comprised of at least one information piece to an event sequence comprised of a plurality of events, including at least one input port for receiving information pieces of the information sequence, at least one output port, and a sequencer coupled with the at least one input port and the at least one output port and including a context generator for generating context information for at least one generated event. The probability estimator is coupled with the sequencer for receiving a generated event of the event sequence and the corresponding context information, and for determining a probability estimate. A core engine is coupled with the sequencer and the probability estimator for processing zero or more information pieces of the information sequence from the sequencer responsive to the probability estimate to generate one event by accounting for a bounded ratio of events to information pieces. The generated event is provided to the probability estimator with corresponding context information from the sequencer for updating the probability estimate, and the generated event is provided to the sequencer for transmittal as the event sequence from the at least one output port.

Having the arithmetic encoder which encodes the event sequence to the information sequence by bounding the ratio of events to information pieces allows for compression of a sequence of data (i.e. binary or M-ary events) in a fashion which allows real-time use of the event sequence. Further, reducing the complexity of the generated information sequence by bounding the ratio of events to information pieces allows decoders with limited processing capabilities (e.g. mobile decoders) to decode the information sequence back to its corresponding event sequence while potentially maintaining real-time processing capabilities, or at least without requiring a user of the information to wait for a significant amount of time while such decoders perform the decoding operations.

Similarly, providing a decoder which decodes the information sequence to an event sequence by accounting for a bounded ratio of events per information piece provides for such real-time use of the event sequence, for example during a video conference call, or for the retrieval and processing of information from storage media, for example retrieving video information such as a movie from a DVD-ROM and processing the video data for use.

In accordance with another embodiment of the invention, an entropy coder for converting at least one event sequence, each event sequence including a plurality of events, to at least one information sequence, each information sequence including at least one information piece, is provided, including an arithmetic encoder for generating zero or more information pieces of at least one information sequence responsive to at least one event of at least one event sequence. The entropy encoder further includes a controller coupled with the arithmetic encoder for constraining a number of events in at least one event sequence as a function of the number of generated information pieces in at least one information sequence. The at least one event sequence may represent input data partitioned into a number of segments, where the controller constrains a number of events as a function of the number of information pieces by constraining a maximum number of events in at least one event sequence as a function of a linear combination including a number of generated information pieces in at least one information sequence, and the number of segments. The entropy encoder may be coupled with a processor for converting input data into the at least one sequence of events, where the entropy encoder is capable of sending information regarding a number of generated information pieces in at least one information sequence to the processor. Further, the processor may be capable of reducing an event rate of at least one event sequence responsive to the information received from the entropy encoder.

Having an entropy encoder capable of constraining a number of events in an event sequence as a function of the number of generated information pieces in an information sequence may allow for the video data to be consistently decoded, accounting for a maximum number of information pieces per group of segments, while maintaining video encoding quality as compared with encoders of the prior art. Additionally, where the encoder receives an indication that the complexity threshold is about to be exceeded, the encoder may generate less events for the next segment of the input data, for example reducing a chance that the constraint threshold for the next segment is exceeded. Further, as the controller is capable of triggering the addition of stuffing bits where the constraint threshold is exceeded, the processor may be implemented in a way that the processor need not account for, or deal with, the complexity constraint. The encoders and the decoder may be utilized in the processing of video data, for example as generated by a video processor (i.e. video codec). In the video processor example, a video image is recorded, and partitioned into sample blocks of data which may represent 16×16, 8×8, or 4×4 samples of the recorded image. The blocks are then transformed by the video processor (i.e. utilizing a discrete cosine transform), and quantized to yield integer values representing the sample block. The integer values are converted to a sequence of events (i.e. binary events) by the video processor, and sent to the encoder for encoding. Alternatively, the video processor may operate directly on individual samples, transforming and quantizing them, and converting the particular quantized integer value for the sample to a sequence of events.

Although one such use for the encoder and decoder discussed herein is in the encoding and decoding of video data, one skilled in the art would realize that the encoder and decoder described herein may be utilized in any situation where a sequence of events is compressed to an information sequence in the case of the encoder, and where such an information sequence is decompressed in the case of the decoder. Further, although the following discussion of the encoder is in the context of processing a sequence of events comprising a plurality of binary events to an information sequence comprising at least one information binary bit, and for the decoder is in the context of processing a sequence of information comprising at least one information binary bit to a sequence of events comprising a plurality of binary events, that the encoder and decoder could operate on event sequences and information sequences comprised of events which are M-ary in nature (i.e. each M-ary event represents >1 bits of data) using the teachings described herein, as would be appreciated by one skilled in the art.

FIG. 1 illustrates a block diagram of an arithmetic encoder 100 in accordance with an embodiment of the invention. The arithmetic encoder 100 includes a sequencer 105, a probability estimator 110, and a core engine 115, which are each coupled with one another. One or more input data lines 120 provide an input port for receiving a sequence of events 125, here an ordered sequence of binary events, to the encoder 100. The binary events of the sequence 125 may have a value "A" or "B". The event sequence is processed by the encoder, as described below, to generate an information sequence which is an ordered sequence comprised of at least one information piece, here binary bits, where the number of information pieces in the information sequence is less than the number of events in the event sequence. The output data lines 130 provide an output port for sending the information sequence 135 from the encoder 100. The ordered sequence of binary bits of the information sequence includes one or more bits having a value of "0" or "1".

Upon receiving the ordered sequence of binary events 125, the sequencer 105 sequentially transmits the events 125 to both the probability estimator 110 and the core engine 115 via event transmission lines 140 and 145 respectively. For each binary event of the event sequence 125, the sequencer 105 also transmits context information to the probability estimator 110 for the binary event via a context transmission line 150. The probability estimator 110, using the context information received via the context transmission lines 150, generates a probability estimate P(A) which is transmitted to the core engine 115 via probability transmission line 155. The probability estimator 110 then updates its internal state based on the value of the binary event received via binary event transmission line 140. The core engine 115 produces 0 or more information bits using the binary event received via event transmission line 145 and the corresponding probability estimate P(A) received via probability transmission line 155, while bounding a ratio of events to information bits, as will be described in more detail below.

The sequencer 105, upon receipt of a first binary event of the event sequence 125, sends an initialization signal to the probability estimator 110 and the core engine 115 via initialization lines 185 and 190 respectively.

In producing the zero or more information bits for transmission, through bit transmission line 158, the core engine 115 utilizes various registers including a range register 165, a low register 170, a bits outstanding register 175, and a counter register 180. Operation of the encoder 100 is described with respect to the flowcharts of FIGS. 2-6.

Figure 2:
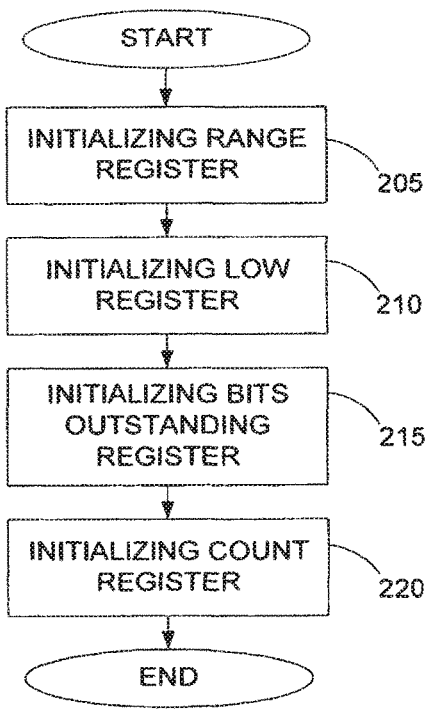
FIG. 2 is a flow chart illustrating initialization of the encoder of FIG. 1 in accordance with an embodiment of the invention.

FIG. 2 illustrates a flowchart describing operation of the core engine 115 upon receipts of an initialization signal from the sequencer 105. As shown in the flowchart of FIG. 2, the core engine 115 initializes the range register 165, for example to a value 8000 hexadecimal (H), as shown at step 205. The core engine 115 also initializes the low register 170, the bits outstanding register 175 and the counter register 180 each to, for example, a value of 0, as shown at steps 210, 215 and 220 respectively.

Figure 3:
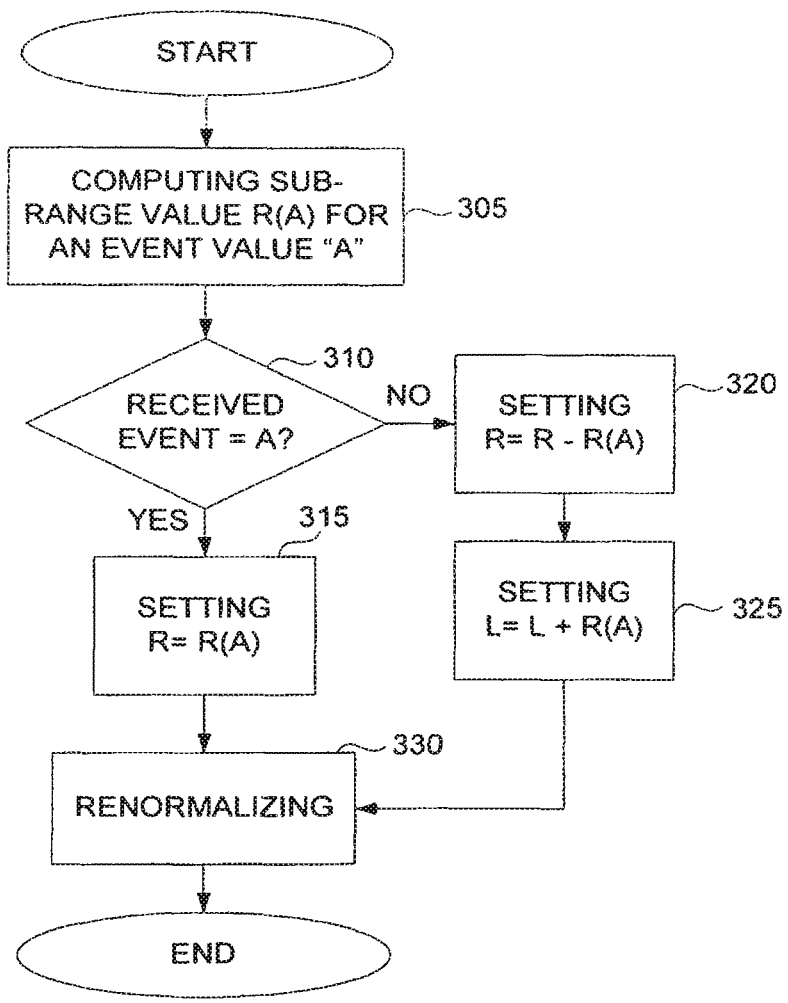
FIG. 3 is a flow chart illustrating operation of the core engine of the encoder of FIG. 1 in accordance with an embodiment of the invention.

After initialization, and upon receiving a binary event of the event sequence 125, the core engine operates as illustrated in the flowchart of FIG. 3 in accordance with an embodiment of the invention.

As shown at step 305 of FIG. 3, the core engine 115 computes a sub-range value R(A) for a particular event value, for example an event value "A", using a current value of the range register 165 and the probability estimate for that particular event value received via the probability transmission line 155. Here, the sub-range value R(A) is computed by multiplying the range register value "R" by the probability estimate P(A). As shown at step 310, a comparator of the core engine 115 (not shown) compares a value "X" of the binary event received via event transmission line 145 with the particular event value A for which the probability P(A) has been generated. Where the received event value X is equal to A, the range register 165 is set to the sub-range value R(A), as shown at step 315 (i.e. the value of R(A) is stored into the range register 165). However, where the receive event value X is not equal to the event A at step 310, the sub-range R(A) is subtracted from the value R of the range register 165, where the resulting value is stored in the range register 165 as shown at step 320. A value L of the low register 170 is summed with the sub-range value R(A) and stored in the low register 170 as shown at step 325. Upon recomputing the value of the range register 165 at step 315, or the low register 170 at step 325, the core engine calls a renormalization routine, as shown at step 330 and further discussed below with respect to the flow chart of FIG. 4, in accordance with an embodiment of the invention.

Figure 4:
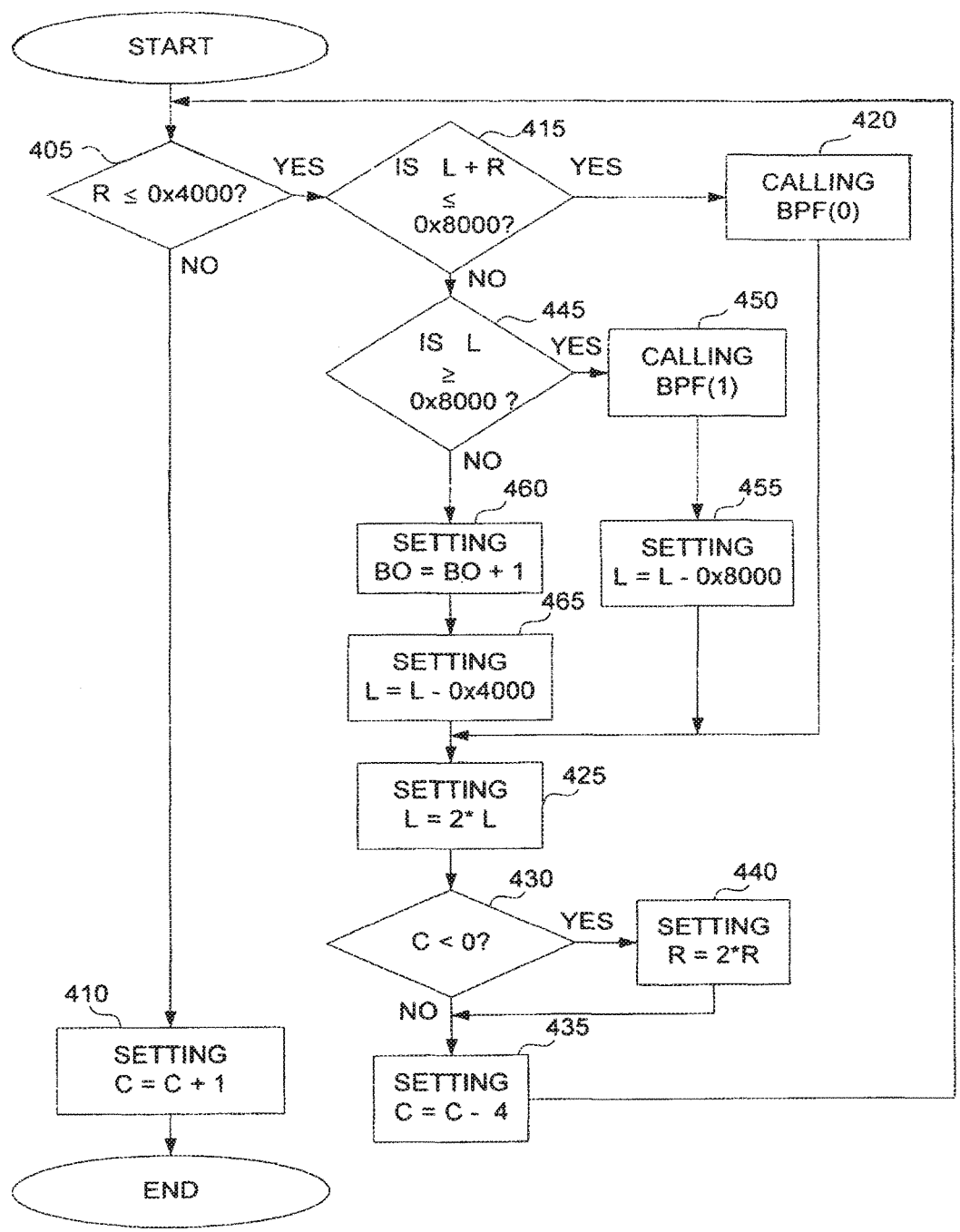
FIG. 4 is a flow chart illustrating the renormalization procedure for the encoder of FIG. 1 in accordance with an embodiment of the invention.

As shown in FIG. 4, renormalization begins where a value of the range register 165 is compared with a predetermined range value, here 4000H as shown at step 405. Where the value R of the range register 165 is >4000H, the counter register is incremented by 1, a predetermined incrementation value, here as shown at step 410. Where it is determined at the core engine 115 that the value R is less than or equal to 4000H at step 405, the value L of the low register 170 and R of the range register 165 are summed, and compared with the value 8000H as shown at step 415. Where the sum is less than or equal to 8000H, a bit plus follow routine is called having a parameter B equal to "0" as shown at step 420 and as will be further discussed below. The value of the low register is then doubled as shown at step 425, and the value C of the counter register 180 is compared with 0 as shown at step 430. Where the value C of the counter register 180 is not less than 0, a decrementation value, here 4H, is subtracted from the counter register 180 as shown at step 435, and flow returns to step 405 and operates as described above. However, where it is determined at step 430 that the value C of the counter register is less than 0, the range register is rescaled by doubling the value R of the range register 165 as shown at step 440, and program flow continues to step 435 as discussed above.

Where it is determined at step 415 that the sum of the values L and R is not less than or equal to 8000H, the value L of the low register 170 is compared with 8000H as shown at step 445. Where the value L is greater than or equal to 8000H, the bit plus follow routine is called with a parameter B equal to "1" as shown at step 450 and discussed further below. A value 8000H is subtracted from the low register 170 as shown at step 455, and flow continues to step 425 as discussed above. However, where it is determined that L is not greater than or equal to 8000H at step 445, the bits outstanding register 175 is incremented by 1 as shown at step 460, and a value 4000H is subtracted from the low register 170 as shown at step 465. Flow then continues to step 425 as discussed above.

Upon receipt of a final event of the event sequence 125, the sequencer 105 sends a terminate signal to the core engine 115 via terminate transmission line 195. Operation of the core engine 115 when a terminate signal is received is shown in the flow chart of FIG. 5 in accordance with an embodiment of the invention.

Figure 5:
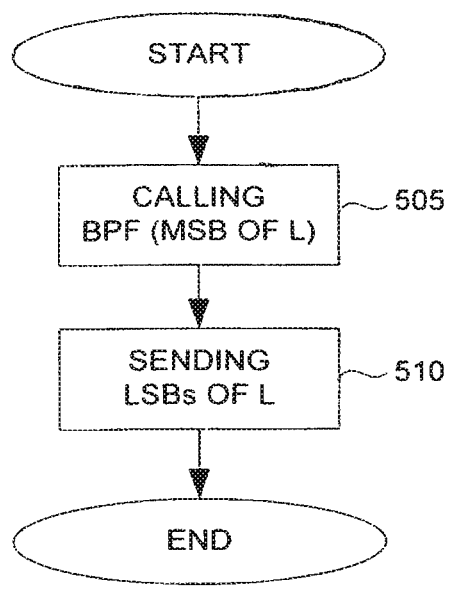
FIG. 5 is a flow chart illustrating the operation of the core engine of the encoder of FIG. 1 upon receiving a terminate signal in accordance with an embodiment of the invention.

As shown in FIG. 5, a bit plus follow routine is called, step 505, with an argument B having the value of the most significant bit (MSB) of the low register 170. The least significant bits (LSB) of the low register 170 are then sent to the sequencer 105 as shown at step 510. The bit plus follow routine is shown in more detail in the flow chart of FIG. 6 in accordance with an embodiment of the invention.

Figure 6:
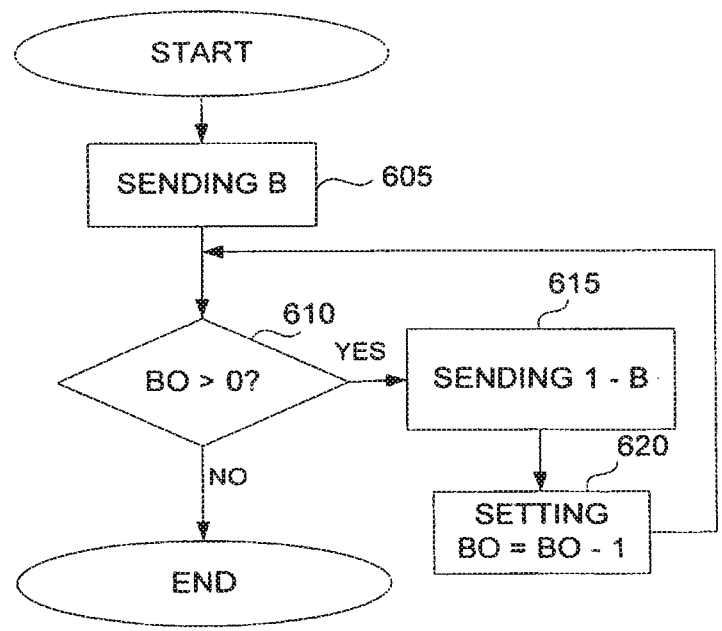
FIG. 6 is a flow chart illustrating a Bit-Plus-Follow routine carried out by the core engine of FIG. 1 in accordance with an embodiment of the invention.

As shown in FIG. 6, a value B is sent as a bit of the information sequence 135 to the sequencer 105 via bit transmission line 158, as shown at step 605. A value BO of the bits outstanding register 175 is compared with 0, at step 610. Where a value BO of the bits outstanding register 175 is not greater than 0, flow returns to whichever program segment/routine that called the bit plus follow routine (i.e. box 420 or box 450 of FIG. 4, or box 505 of FIG. 5). However, where the value BO is greater than 0 at step 610, a bit of the information sequence 135 having a value of 1 less the value B is sent to the sequencer 105 via bit transmission line 158, as shown at step 615. The value BO of the bits outstanding register is decremented by 1 as shown at step 620, and flow returns to step 610, and continues as discussed above.

Thus, providing the encoder 100 having a core engine 115 with the counter 180 allows for tracking the ratio of events to information pieces, thereby allowing such ratio to be bounded in order to reduce the complexity bound of the information sequence provided by the encoder. The counter incrementation value discussed with respect to step 410, the counter decrementation value discussed with respect to step 435 and the value which the counter register 180 is compared against at step 430 are used in governing the average ratio of events to information pieces. For example, with the values discussed above with respect to FIG. 4, having a decrementation value of 4 at step 435 results in the average ratio of events to information pieces being bounded at 4. Altering the decrementation value alters the average ratio of events to information pieces. Accordingly, the incrementation value, the decrementation value and the value to which the counter is compared are merely exemplary, as such values, along with the value to which the counter register 180 has been initialized at box 220 of FIG. 2, need not be as described above, but may be any integer value, where the corresponding values will be selected to achieve the desired bounded average ratio of events to information pieces as would be appreciated by one skilled in the art.

Figure 7:
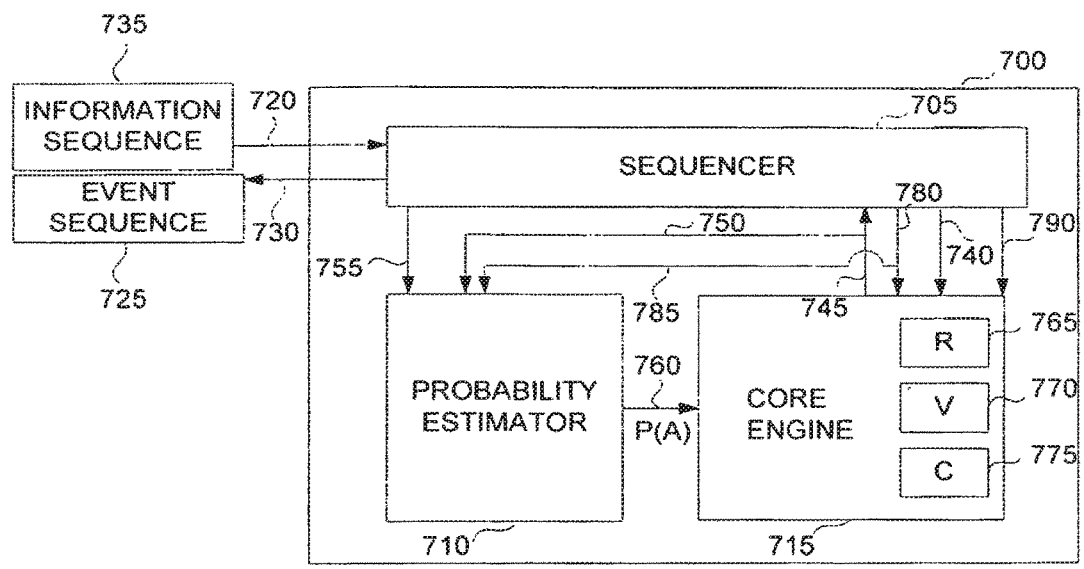
FIG. 7 is a block diagram illustrating a decoder in accordance with an embodiment of the invention.
Figure 8:
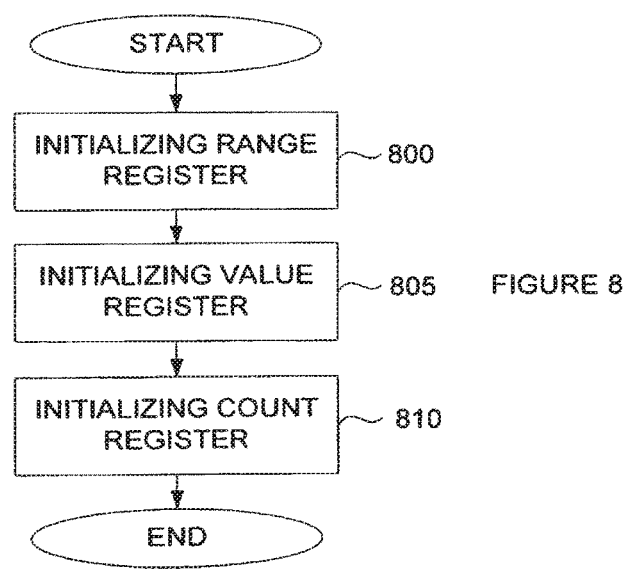
FIG. 8 is a flow chart illustrating initialization of the decoder of FIG. 7 in accordance an embodiment of the invention.
Figure 9:
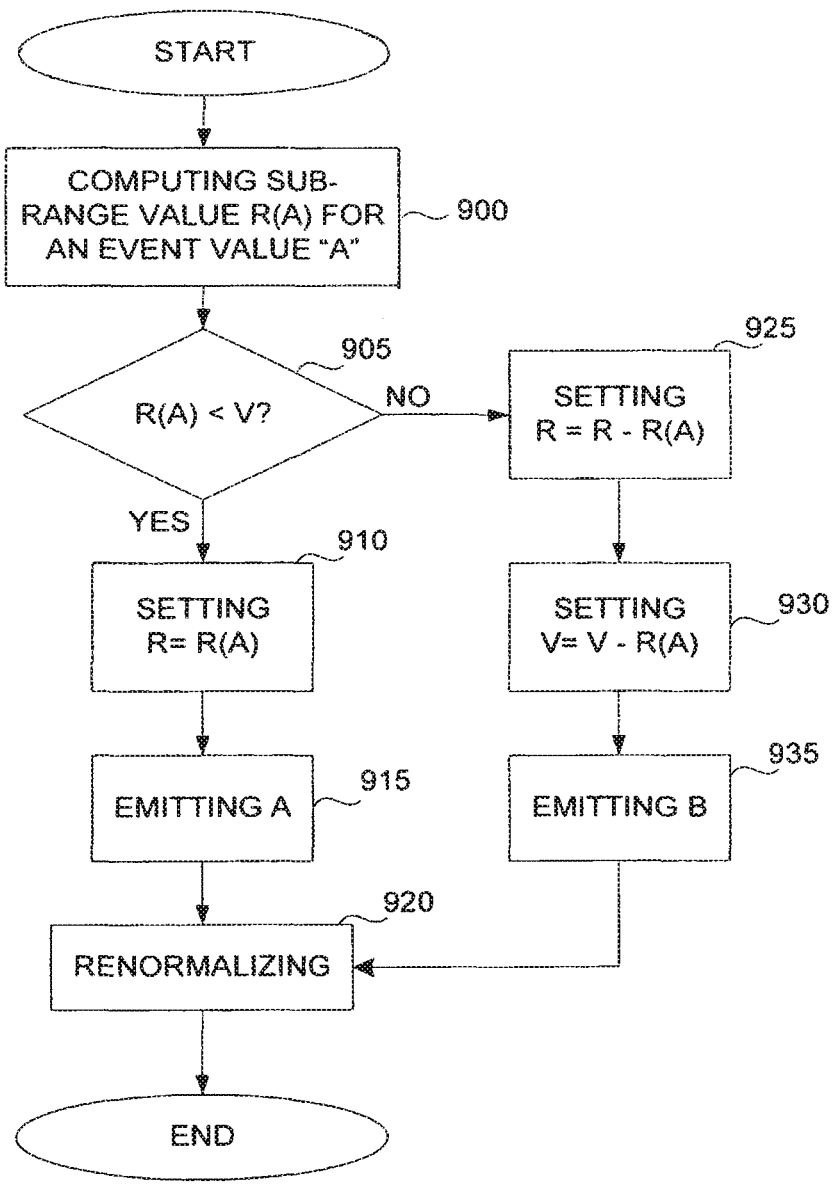
FIG. 9 is a flow chart illustrating the operation of the core engine of the decoder of FIG. 7 in accordance with an embodiment of the invention.
Figure 10:
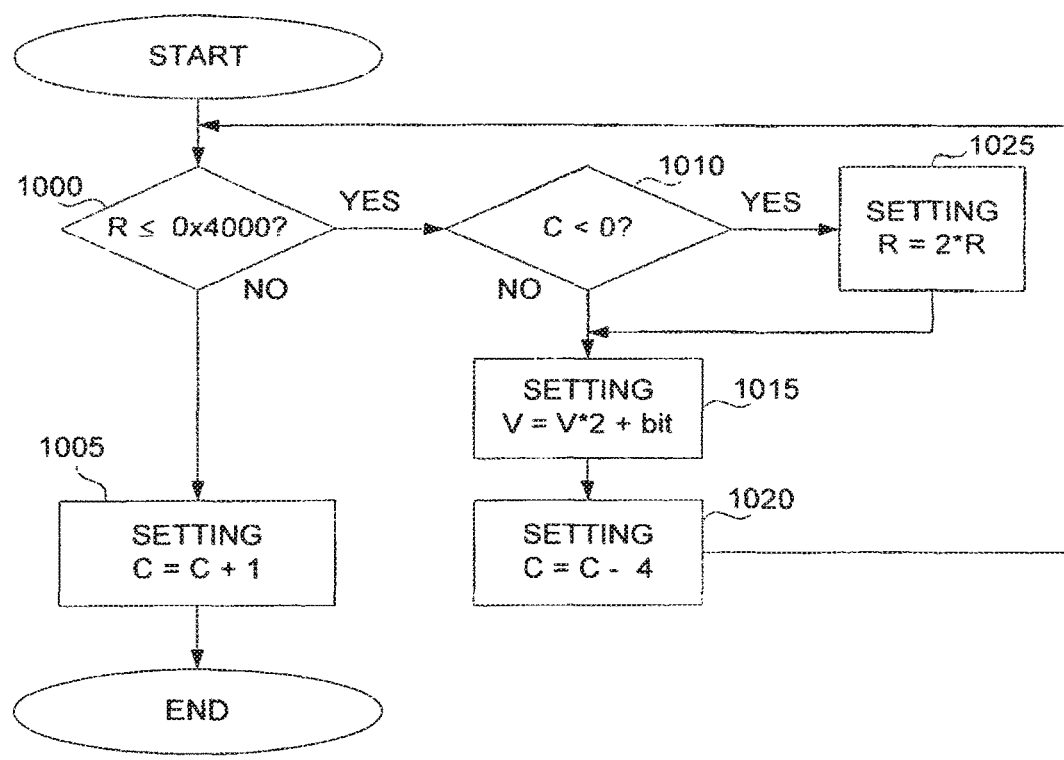
FIG. 10 is a flow chart illustrating renormalization of the core engine of the decoder of FIG. 7 in accordance with an embodiment of the invention.

FIGS. 7-10 illustrate an arithmetic decoder and the operation thereof which is capable of decoding an information sequence comprised of at least one information piece to an event sequence comprising a plurality of events, by accounting for a bounded ratio of events to information pieces in the information sequence. FIG. 7 is a block diagram of the decoder, where FIGS. 8-10 are flowcharts illustrating operation of the decoder.

FIG. 7 illustrates an arithmetic decoder 700 in accordance with an embodiment of the invention. The decoder 700 includes a sequencer 705, a probability estimator 710, and a core engine 715 coupled with one another. One or more information sequence input data lines 720 provide an import port for a sequence of information 735, here in ordered sequence of binary bits, to the decoder 700. The binary bits of the sequence 735 may have a value of "0" or "1". The decoder processes the information sequence to generate an event sequence by accounting for the bounded ratio of events to information pieces in the information sequence, as discussed further below. The generated sequence of events is an ordered event sequence comprising a plurality of events, here binary events, which may have a value of "A" or "B". The event sequence is provided to output event sequence data lines 730, which provides at least one output port from the decoder 700.

Upon receiving the ordered sequence of binary bits 734, the sequencer 705 sequentially transmits the one or more bits to the core engine 715 via bit transmission line 740. Upon receiving the one or more bits, the core engine 715 begins generating events, here binary events, which are transmitted to the sequencer 705 and probability estimator 710 via event transmission lines 745 and 750 respectively. As further discussed below, the probability estimator sends an initial probability estimate to the core engine for generating the first binary event. Thereafter, for each binary event generated by the core engine 715 and sent to the sequencer 705, the sequencer 705 transmits a corresponding context to the probability estimator 710 over the context transmission line 755. Based on the value of the context received via context transmission line 755, the probability estimator 710 generates a corresponding probability estimate P(A), which is sent to the core engine 715 over probability transmission line 760, and used by the core engine 715 in generating further events. After transmitting the probability estimate P(A), the probability estimator 710 updates its internal state based on the value of the binary event received from the core engine 715 over event transmission line 750. The core engine 715 consumes zero or more information bits for each binary event generated. The core engine 715 utilizes various registers in generating the events of the event sequence 725, including a range register 765, a value register 770 and a counter register 775. An initialization signal is provided to the core engine 715 and the probability estimator 710 via initialization transmission lines 780 and 785 respectively. A terminate signal is provided to the core engine 715 via a terminate signal line 790. Operation of the decoder 700 is shown in the flowcharts of FIGS. 8-10.

FIG. 8 illustrates operation of the decoder 700 upon receipt of an initialization signal via initialization signal line 780 in accordance with an embodiment of the invention. As shown in FIG. 8, the core engine 715 initializes the range register 765 to a value of 8000H as shown at step 800, and initializes the value register 770 to a particular value represented by 16 bits (discussed below) as shown at step 805. Further, the core engine 715 initializes the counter register 775 to a value of zero as shown at step 810.

The value register 770 is initialized at step 805 by collecting 16 bits into the value register 770, for example the first 16 information pieces of the information sequence, as described in Arithmetic Coding Revisited, by Moffat et al., ACM Transactions on Information Systems, VOL. 16, NO. 3, July 1998, pages 256-294, hereby incorporated by reference herein, and as would be appreciated by one skilled in the art.

FIG. 9 is a flow chart illustrating operation of the core engines 715 in generating the event sequence 725 in accordance with an embodiment of the invention. As shown at step 900, a subrange value R(A) is computed by the core engine 715 for an event value "A". The subrange value R(A) is computed based on the value of the range register 765 and determined probability estimate P(A) received via the probability estimate transmission line 760 from the probability estimator 710, by multiplying the value R of the range register 765 by the probability estimate P(A). When computing the sub-range value R(A) for the first time for a particular information sequence 735, the probability estimator 710 determines the probability estimate P(A) to be some initial/predetermined probability estimate (i.e. agreed-upon ahead of time). Thereafter, as events are emitted from the core engine 715, the probability estimator 710 utilizes the emitted events along with corresponding context information received via context information line 755 in updating the probability estimate P(A) provided via probability estimate transmission line 760, as discussed below.

The subrange value R(A) is then compared with a Value V of the value register 770 as shown at step 905. Where the subrange value R(A) is less than the valve V of the value register 765, the range register 165 is set to the subrange value R(A) as shown at step 910, and an event "A" is emitted to the sequencer 705 via event transmission line 745 as shown at step 915. A renormalization procedure is then called, as shown at step 920, and which will be discussed in further detail with respect to the flow chart of FIG. 10.

Where the subrange value R(A) is not less than the value V of the value register 770 at step 905, the subrange value R(A) is subtracted from the range register 765 as shown at step 925. The subrange value R(A) is subtracted from the value register 770 as shown at step 930, and an event "B" is emitted from the core engine to the sequencer 705 via event transmission line 745, as shown at step 935. Flow continues to the renormalization procedure at step 920.

As discussed above, upon emission of an event via the event transmission line 745, the sequencer 705 transmits a context via the context transmission line 755 to the probability estimator 210, where the probability estimator 710 updates its internal state based on the value of the binary event emitted by the core engine 715.

FIG. 10 is a flow chart illustrating operation of the core engine 115 when carrying out the renormalization discussed above with respect to step 920 in accordance with an embodiment of the invention. As shown at step 1000, the value R of the range register 765 is compared with a predetermined range value, here 4000H. Where the predetermined value R is not less than or equal to 4000H, the counter register 775 is incremented by a predetermined incrementation value, here 1, as shown at step 1005, and renormalization is complete. However, where the value R of the range register 765 is less than or equal to 4000H a value C of the counter register 775 is compared with 0 as shown at step 1010. Where the value C of the counter register 775 is not less than 0, the value V of the value register 770 is doubled, and added with a value of the most recent bit received at the core engine 715 via the bit transmission line 740, where the resulting sum is stored in the value register 770 as shown at step 1015. As shown at step 1020, a value C of the counter register 775 is decremented a predetermined decrementation value, here 4H, and flow returns to step 1000. Where a value C of the counter register is less than 0 at step 1010, the range register 765 is rescaled by doubling the value R of the range register as shown at step 1025, and flow continues to step 1015 as described above.

After a final piece of information of the information sequence 725 is transmitted to, and processed by the core engine 715, the sequencer 705 transmits a terminate signal to the core engine 715 via terminate signal transmission lines 790 indicating to the core engine 715 that the decoding of the information sequence 725 is complete. The core engine 715 need perform no operation in response to the termination signal.

The encoder 100 with a reduced complexity bound that is capable of encoding an event sequence to an information sequence by bounding a ratio of events to information pieces is advantageous as providing an information sequence which may be decoded and used to support the providing of the information for real-time use, without significantly affecting the encoding efficiency of the information sequence. Additionally, such a reduced-complexity encoding may be beneficial where the decoder used in decoding the information sequence possesses reduced-processing capabilities (i.e. is on a mobile device) as such a decoder would be capable of decoding the information sequence without undue delay in waiting for the decoding to be accomplished. Further, the decoder 700 capable of decoding an information sequence to an event sequence by accounting for a bounded ratio of events to information pieces in the information sequence, may be advantageous as allowing an efficient decoding of the information sequence for use in, for example, real-time use of the event sequence.

Figure 11:
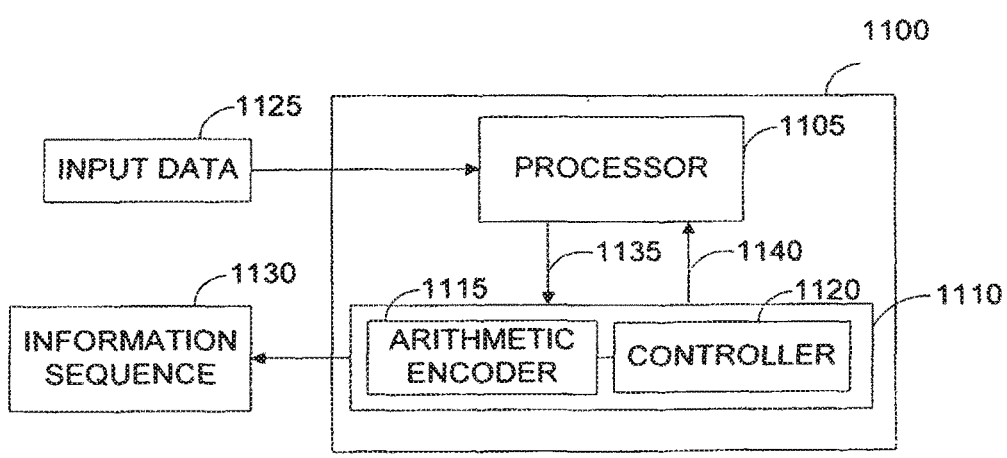
FIG. 11 is a block diagram of an encoder in accordance with another embodiment of the invention.

FIG. 11 illustrates an encoder 1100 in accordance with another embodiment of the invention. As shown in FIG. 11, the encoder includes a processor 1105 coupled with an entropy encoder 1110. The entropy encoder includes an arithmetic encoder 1115 coupled with a controller 1120. Input data 1125 is received at the encoder, and is encoded to one or more sequences of information pieces shown at 1130.

The input data 1125 may be any data to be encoded by the encoder 1100, including, for example, video data. The processor 1105 receives the input data, and converts the input data into one or more sequences of events 1135. The processor 1105 may partition the input data into one or more segments of information (not shown). For example, where the input data 1125 is video data, the processor may partition the video data into blocks of data, for example representing 16×16 samples of the corresponding video image. A sequence of events 1135 may represent one or more segments (video blocks).

The entropy encoder 1110 receives the sequence of events 1135 to be arithmetically encoded, where the arithmetic encoder 1115 generates 0 or more bits of the information sequence 1130 for each event of the sequence of events 1135. The controller 1120 is capable of regulating the entropy coder 1110 by constraining the number of information pieces of the information sequence 1130 as a function of the number of the events of the sequence of events 1135, such that the number of events does not exceed a threshold with respect to the number of information pieces generated. Where the threshold is exceeded, the controller 1120 may control the entropy coder to add one or more stuffing pieces of information to the information sequence 1130 to achieve the threshold.

The entropy encoder may encode the sequence of events 1135 in a similar fashion as described above with respect to the arithmetic encoder 100 of FIG. 1. For example, the arithmetic encoder 1115 may include, where appropriate, a sequencer, and probability estimator as described above with respect to FIG. 1. The arithmetic encoder 1115 may further include a core engine with Range. Low and Bit Outstanding Registers. The controller 1120 may include one or more counters for tracking a number of events of the sequence of events 1135 processed and a number of information pieces of the information sequence 1130 generated. Alternatively, the one or more counters may be present within the entropy coder 1110, where the controller 1120 is capable of monitoring the counter(s) to ensure the threshold between events processed and information pieces generated is substantially maintained. The controller 1120 may constrain the number of information pieces, for example, over each individual sequence of events being encoded. For example, the controller may ensure that (# generated information pieces)×(threshold)≥(# events processed). This may be accomplished, for example, in a similar fashion as discussed above with respect to FIGS. 1-6, and specifically FIG. 4, where the controller increments a counter for each event processed, and subtracts a number from the counter representing the threshold value, for example "4" when a bit is processed. The controller may then compare the value of the counter, with for example the value 0, and trigger the insertion of a stuffing bit if the value of the counter is larger than 0. In this way, the controller is capable of ensuring that the arithmetic encoder 1115 is substantially constrained to a 4:1 ratio of events processed to information pieces generated.

In addition, or in the alternative, the controller may constrain the number of events of the sequence of events 1135 as a function of the number of information pieces in the sequence of information pieces, and a number of segments of the input data 1125 represented in the sequence of events. For example, the constraining may take the form of a linear combination:

$$e \leq \alpha B + \beta S,$$

where
e is the number of events represented in the sequence of information pieces,
B is a number of information pieces in the sequence of information pieces,
S is a number of segments represented in the sequence of events, and
α and β represent a decrement value to a counter utilized by the controller to substantially maintain a constraint of the number of events of the sequence of events with respect to a number of information pieces generated.

The values for α and β are typically provided to the controller 1120, and the derivation of α and β will be discussed below. The value α may represent a decrement value to, for example, a counter upon generation of an information piece at the coder, where the value β may represent decrement value to, for example, a counter upon completion of processing a segment. In the alternative, the value β may be decremented from a counter value at the beginning of processing of a segment, or at any other time during the processing of a segment as would be apparent to one skilled in the art.

A rate control line 1140 may be utilized in constraining the number of events of the sequence of events 1135 as a function of the number of information pieces in the sequence of information pieces, and a number of segments of the input data 1125 represented in the sequence of events. For example, the rate control line 1140 may be used to carry information relating to the complexity constraint (MEPS and/or PMEPS, see below) from the entropy encoder 1110 to the processor 1105. The entropy encoder may indicate to the processor that the constraint threshold is about to be, or is exceeded, for example, by transmitting information regarding the value of the counter(s). The processor 1105 may thus reduce the event rate (i.e. reduce the number of events per segment/block), for example, to reduce the likelihood of the controller 1120 triggering the insertion of stuffing bits into the information sequence 1130.

In some circumstances, the particular number of segments of data of the input data 1125 that will be processed may be known at the encoder 1100, for example, where the sequence of information pieces need not be substantially limited for transmission over a particular communication medium. In these circumstances, the sequence of information pieces generated at the encoder 1100 may represent an entire coded image for transmission generated from a known number of segments of the input data 1125. Where the particular number of segments of data of the input data that will be processed is known, the controller may, for example, constrain the number of events in the sequence of events 1135 as:

$$e - \beta S \leq \alpha B,$$

Since the total number of segments, S, and the value β are known, the product of β×S may be subtracted from the number of events, e, for the sequence of events 1135 during or after processing of the one or more segments of the input data 1125. For example, where a counter is utilized to constrain the number of events responsive to the number of bits that have been generated, the counter may initially be decremented by a value of β×S, and may be decremented by a value α for each information piece generated, while the counter is incremented by "1" for each event of the sequence of events 1135 processed by the entropy encoder 1110. The value of β may be any value, typically in the range of 1 to 100, and may be determined, for example, as described further below. The value of α may be any value, typically in the range of 1 to 10, and may be determined, for example, as described further below.

In some circumstances, a number of segments of the input data 1125 to be processed is not known in advance, for example, where the communication medium limits the number of information pieces that may be provided in the information sequence 1130. This may occur, for example, where the information sequence 1130 is to be transmitted over the Internet, as an Internet Protocol (IP) packet, where the IP packet has a maximum size limitation. In these circumstances, depending on the complexity of a particular image, one or more sequences of information pieces may be required to represent a single image of the input data 1125. However, the number of segments utilized for generation of a sequence of information pieces may not be know in advance, since it may not be known after how many processed segments the maximum size of a sequence of information pieces will be reached. Where a number of segments of the input data 1125 to be processed is not known in advance, the controller may account for the plurality of sequences of events as the one or more segments representing a particular sequence of events is encoded. For example, where a counter is utilized to constrain the number of events responsive to the number of bits that have been generated, the counter may be decremented by a value β for each segment processed, and may be decremented by a value α for each information piece generated, while the counter may be incremented by "1" for each event of the sequence of events 1135 processed by the entropy encoder 1110.

The values for α and β may be determined, for example, by accounting for limitations imposed by a particular standard (i.e. a standard governing video coding), and/or limitations with respect to a decoder that will be utilized to decode the information sequence encoded by the encoder 1100. Such limitations imposed by the particular standard may include information regarding a maximum number of bits per second (MBPS), a maximum number of segments (blocks) per second (MSPS), and a peak maximum number of bits per second (PMBPS). The PMBPS may represent, for example, a maximum number of bits of a picture divided by the temporal distance between two pictures to be coded.

The MBPS may account for channel capacity, for example, approximately 64 000 bits per second for mobile communication applications, 500 000 bits per second for digital subscriber line (DSL), and 4 000 000 bits per second for broadcast applications such as television (TV). The MSPS may account for the video format standard, for example, 176×144 pixels at 10 or 15 frames per second for mobile (i.e. cellular telephone) applications, 320×240 pixels at 24 frames per second for DSL applications, 720×480 pixels at 30 frames per second for standard TV applications, and 1920×1088 pixels at 30 frames per second for High-Definition TV. PMBPS may be any multiple of the MBPS, typically several times MBPS, for example, PMBPS≈10× MBPS.

Depending on the particular implementation, the resources of a decoder (i.e. processing capabilities and/or available buffer memory) may be limited, and may also be taken into account when determining the values of $\alpha$ and $\beta$. Such limitations may include actual or assumed values for a maximum number of events per second (MEPS) that can be processed by the decoder, and/or a peak maximum number of events per second (PMEPS) that can be processed by the decoder (i.e. a maximum number of events in a picture divided by the temporal distance between two pictures to be decoded).

Accounting for one or more of the above limitations of the decoder, $\alpha$ and $\beta$ may be represented in a linear system as:

$$PMEPS = \alpha * PMBPS + \beta * MSPS, \text{ and}$$

$$MEPS = \alpha * MBPS + \beta * MSPS.$$

The values of $\alpha$ and $\beta$ may be determined by solving the linear system for $\alpha$ and $\beta$, given for example, the limitations PMBPS and MSPS set by the particular standard, and one or both of the limitations PMEPS and MEPS of the decoder. The values for $\alpha$ and $\beta$ need not be integer values, but rather may be any values to substantially satisfy the linear system.

The values of $\alpha$ and $\beta$ may be determined in advance, by a system designer of the encoder 1100 accounting for one or more of the limitations discussed above, and provided to the controller 1120. Alternatively, or in addition, the values of $\alpha$ and $\beta$ may be determined by the controller 1120, or any other component of the encoder 1100, in accordance with one or more of the limitations discussed above, or as encoder 1100 default values. Where the controller 1120 determines values for $\alpha$ and $\beta$ using one or both of the limitations imposed by the standard or by a decoding device, the information regarding one or more of the limitations may be stored at a memory (not shown) of the controller 1120, and used by the controller 1120 in determining the $\alpha$ and $\beta$ values. Additionally, or in the alternative, information regarding the limitations may be provided to the controller 1120, for example, by some external device such as an external memory (i.e. a Digital Video Disc (DVD)), a DVD player device, or from a systems engineer, for example, handling some of the functions with regards to encoding the particular input data 1125. In the latter case, the systems engineer may enter into a console or other input device (not shown), or otherwise specify, information with regards to limitations imposed as a result of an encoding standard and/or a decoding device, as would be appreciated by one skilled in the art.

Where one or both of the decoder limitations PMEPS and MEPS are not known, values for the PMEPS and MEPS may be assumed, for example, as minimum operational requirements for a decoder to possess to be capable of decoding the information sequence 1130 generated by the encoder 1100. Further, when assuming the values for PMEPS and/or MEPS, considerations as to, for example, a percentage of time the decoder will utilize for arithmetically decoding data, may be accounted for. For example, it may be assumed that the decoder will be capable of expending no more than 30% of its processing time/capabilities to carry-out arithmetic decoding of an information sequence received at the decoder.

Further, even though the values of $\alpha$ and $\beta$ may be determined utilizing the above linear system, such values may be adjusted to achieve desired encoding performance, where the adjusted values for $\alpha$ and $\beta$ may subsequently be utilized by the encoder 1100 for encoding the input data 1125 to the information sequence 1130. For example, the values of $\alpha$ and $\beta$ may be adjusted with considerations as to a potential loss of video quality due to the information pieces stuffed in the information sequence 1130. It may be desirable, for example, to minimize the number of stuffed information pieces such as to maintain good video quality (i.e. video with little or no distortion) while bounding the decoding complexity. Such a trade-off between decoding complexity and video quality may be determined experimentally, and may account for the particular video coding algorithm utilized by the encoder 1100.

In addition, when determining the values for $\alpha$ and $\beta$, considerations may be made as to whether the complexity constraint is too tight, for example, the values for $\alpha$ and/or $\beta$ are too low. A high proportion of stuffing information pieces in the sequence of information pieces (i.e., a number of stuffing pieces greater than approximately 1% or 2% of the information pieces of the information sequence) may indicate that the constraint it too tight. One skilled would realize that other proportions may indicate a high proportion of stuffing information pieces, for example, taking into account the particular standard and/or decoder that may be used.

Where it is determined, for example, that the values for $\alpha$ and $\beta$ are too tight, the values for $\alpha$ and $\beta$ may be increased to reduce the likelihood that stuffing bits will be added (i.e. reducing the likelihood of a quality penalty in the encoded information sequence). When increasing the values for $\alpha$ and $\beta$, considerations may be made as to the effect on the resulting complexity bounds (i.e., MEPS and/or PMEPS) with respect to a decoder that will be utilized to decode the encoded information sequence. Such considerations may include the cost to implement the decoder. If the complexity bound is higher, more processing power may be required in the decoder. An increase in required processing power could likely result in higher implementation cost.

Alternatively, $\alpha$ and $\beta$ can be determined experimentally, using linear regression techniques. A number of sequences of events, each representing S segments, may be encoded without enforcing any complexity constraint. For each sequence z of events, it is known for the number of events e(z), the number of resulting generated information pieces B(z). It may be determined, using linear regression, a line $e = c*B + d$ that approximates the data pairs (e(z), B(z)). An initial value of $\alpha$ may be indicated by c, and an initial value of $\beta$ may be indicated by d/S. The values for $\alpha$ and/or $\beta$ may then be increased such as to minimize the number of data pairs (e(z),B(z)) that lie above the line $e = \alpha*B + \beta*S$. The amount by which $\alpha$ and/or $\beta$ are increased will likely also take the resulting values of MEPS and/or PMEPS into account, for example, to control implementation cost of a decoder.

Utilizing the values for $\alpha$ and $\beta$ as determined by one or more of the various techniques discussed above, the encoder 1100 may account for a value of $\alpha$ (i.e. decrement a counter by the value of $\alpha$) for each information piece generated, and may account for a value of β (i.e. decrement a counter by the value of β) upon completion of a segment of the input data 1125. For example, where α and β are integer values, such accounting (i.e. decrements to one or more counters) may be accomplished directly.

Where, for example, one or both of α and β are fractional values, a common denominator may be determined to provide non-fractional values for α and β. In this circumstance, the newly, non-fractional values for α and β may be accounted for as described above, for example by decrementing a counter by the values of α and β upon information piece generation and completion of segment processing, respectively. The determined common denominator may be accounted for, for example, by adding the value of the common denominator to the counter value upon processing of each event of the event sequence 1135. For example, where the values for α and β are determined to be 4/3 and 25 respectively, a common denominator may be determined as 3. Non-fractional values for α and β may thus be determined as 4 and 75 respectively, using the common denominator. Thus, where a counter is utilized to account for the values of α and β, the counter may be decremented by 4 for each information piece generated, decremented by 75 upon completion of processing each segment, and incremented by 3 for each event processed.

Having an encoder capable of constraining a number of information pieces over one or more segments of the input data may allow for the video data to be consistently decoded, accounting for a maximum number of information pieces per group of segments, while maintaining video encoding quality as compared with encoders of the prior art. Additionally, where the encoder receives a signal through the rate control line that the complexity threshold is about to be exceeded, the encoder may generate less events, for example β or less events from the next segment of the input data, to avoid exceeding that threshold for this next segment/block. Having a value of β different from zero may thus help the processor 1105 in adjusting video quality. In addition, as the controller typically triggers the addition of stuffing bits where the constraint threshold is exceeded, the processor may be implemented in a way that the processor need not account for, or deal with, the complexity constraint. Thus, if the processor satisfies the limits imposed by the particular standard, for example, limits regarding one or more of MSPS, MBPS and PMBPS, it will also satisfy the complexity limits MEPS and/or PMEPS (i.e. derived from α and β as discussed above).

Although the constraining the number of events responsive to the number of information pieces generated has been discussed with respect to the encoder 1100, one skilled will realize that a similar constraining of the number of events of the sequence of events responsive to the number of information pieces in the information sequence may be accounted for in the encoder 100 discussed above with respect to FIG. 1. Further, although the controller 1120 has been described as coupled to the arithmetic encoder 1115, one skilled will realize that such coupling may be direct, or through other intervening devices. Such coupling allows direct and/or indirect communication between the controller 1120 and the arithmetic encoder 1115, such that the controller 1120 is capable of regulating the entropy coder 1110 by constraining the number of information pieces of the information sequence 1130 as a function of the number of the events of the sequence of events 1135.

The encoders 100 and 1100, and decoder 700, described herein may be comprised completely of hardware, as software running on a suitable microprocessor, or as a combination of hardware or software. The functionality of core engines 115 and 715, as well as the arithmetic encoder 1115, controller 1120 and processor 1105, may be carried out as a computer program running on a suitable microprocessor, and the counter registers 180 and 775 may be a register residing within the microprocessor, or may be resident on some external storage media in communication with the microprocessor, for example, RAM, EEPROM, or any rewriteable magnetic, optical or other storage media as would be appreciated by one skilled in the art. As discussed above, although the encoders 100 and 1100, and decoder 700, have been discussed as processing a binary event sequence to a binary information sequence in the case of the encoders, and a binary information sequence to a binary event sequence in the case of the decoder, one skilled in the art would realize that, using the teachings described herein, and M-ary event sequence may be processed and produced while still achieving the advantages discussed herein.

Further, the sign of the counter registers 180 and 775 may be inverted while still achieving the advantages discussed herein, where the incrementations to the counter register described at steps 410 and 1005 would be changed to decrementations, the decrementations to the counter register described at steps 435 and 1020 would be changed to incrementations, and the comparisons with the counter register at steps 430 and 1010 would be changed to determining whether the value of the respective counter register is >zero.

Additionally two counters may be used instead of one. The first counter C1 may count events, and the second counter C2 may count bits. In such a case, a comparison between the two counters may be whether C1<4*C2 in determining whether (or accounting for) the predetermined ratio of events to bits is substantially maintained.

Additionally, although the encoder 100 and decoder 700 have been described as separate hardware, one skilled in the art would realize that the functionality carried out by each as described herein could be integrated into a single unit, for example which may be useful in the case of a personal computer (PC) being used for a video conference where the processor and storage media of the PC would be used to accomplish the functionality of the encoder and decoder described herein.

The bounding ratio of events to information pieces and accounting for a bounded ratio of events to information pieces accomplished by the core engines discussed herein may be accomplished on other core engine designs, including that of a Q-coder, MQ-coder, Z-coder, as well as those discussed in "Low Complexity Arithmetic Coding Implementation", Rene van der Vleuten, Document JVT-B033, JVT meeting in Geneva, Switzerland, January 2002, and "Low-Complexity Arithmetic Coding Engine", Winger, Document JVT-B036, JVT meeting in Geneva, Switzerland, January 2002, both of which are incorporated by reference herein.

Thus, an encoder with a reduced complexity bound has been described which is capable of encoding an event sequence to an information sequence by bounding a ratio of events to information pieces. Such an encoder is advantageous as providing an information sequence which may be decoded and used to support the providing of the information for real-time use, without significantly affecting the encoding efficiency of the information sequence. Additionally, such a reduced-complexity encoding may be beneficial where the decoder used in decoding the information sequence possesses reduced-processing capabilities (i.e. is on a mobile device) as such a decoder would be capable of decoding the information sequence without undue delay in waiting for the decoding to be accomplished. Additionally, an encoder capable of constraining a number of information pieces over one or more segments of the input data may has been describes, that may allow for the video data to be consistently decoded, accounting for a maximum number of information pieces per group of segments, while maintaining video encoding quality as compared with encoders of the prior art. Where the encoder receives a signal through the rate control line that the complexity threshold is about to be exceeded, the encoder may generate less events, to avoid exceeding that threshold for this next segment of the input data. In addition, as the controller typically triggers the addition of stuffing bits where the constraint threshold is exceeded, the processor may be implemented in a way that the processor need not account for, or deal with, the complexity constraint. Further, a decoder is described, capable of decoding an information sequence to an event sequence by accounting for a bounded ratio of events to information pieces in the information sequence, thereby allowing an efficient decoding of the information sequence for use in, for example, real-time use of the event sequence.

While this invention has been shown and described in connection with particular embodiments, it is apparent that certain changes and modifications in addition to those mentioned above may be made from the basic features of this invention. In addition, there may be many different types of computer software and hardware that may be utilized for practicing the invention, and the invention is not limited to the examples described above. Accordingly, the described embodiments are to be considered in all respects only as illustrative and not restrictive, and the scope of the invention is therefore indicated by the appended claims rather than the foregoing description. All changes that come within the scope and range of the equivalency of the claims are to be embraced within their scope.

What is claimed is:

1. A method of arithmetic decoding for converting an information sequence comprised of information pieces to derive an event sequence comprised of events, the method comprising:
  receiving the information pieces of the information sequence;
  generating context information for the events;
  generating, according to the generated context information, a probability estimate estimating a probability of occurrence of the events;
  converting the received information pieces to derive the events, using the generated probability estimate, by accounting for a bounded ratio of events to information pieces;
  wherein accounting for a bounded ratio of events to information pieces comprises increasing a number of the information pieces so that a number of the events being outputted resulting from the increased number of information pieces does not exceed a threshold which is a linear function of the increased number of information pieces.

* * * * *